(12) United States Patent
Beck et al.

(10) Patent No.: US 6,431,908 B1
(45) Date of Patent: Aug. 13, 2002

(54) SPRING ELECTRICAL CONNECTORS FOR A MEGASONIC CLEANING SYSTEM

(75) Inventors: Mark J. Beck, Los Gatos; Richard V. Beck, Saratoga, both of CA (US)

(73) Assignee: Product Systems Incorporated, Campbell, CA (US)

( * ) Notice: Subject to any disclaimer, the term of this patent is extended or adjusted under 35 U.S.C. 154(b) by 0 days.

(21) Appl. No.: 09/663,818

(22) Filed: Sep. 15, 2000

Related U.S. Application Data

(63) Continuation-in-part of application No. 09/543,204, filed on Apr. 5, 2000, now Pat. No. 6,222,305.
(60) Provisional application No. 60/154,481, filed on Sep. 17, 1999.

(51) Int. Cl.[7] .................................................. H01R 3/00
(52) U.S. Cl. .......................... 439/500; 439/66; 310/355
(58) Field of Search ............................ 439/500, 66, 70, 439/700; 310/334, 328, 324, 355

(56) References Cited

U.S. PATENT DOCUMENTS 5,109,596 A * 5/1992 Driller et al. ................. 29/705
5,213,513 A * 5/1993 Brown et al. .................. 439/68
5,395,249 A * 3/1995 Reynolds et al. ............. 439/65

* cited by examiner

Primary Examiner—Brian Sircus
Assistant Examiner—Michael C. Zarroli
(74) Attorney, Agent, or Firm—Donald J. Pagel

(57) ABSTRACT

A system for making electrical connections to a piezoelectric crystal in a megasonic transducer. The system comprises a printed circuit board, one or more first spring connectors and one or more second spring connectors. The printed circuit board has a first copper trace plated on it that is adapted for electrical connection to the active terminal of an RF generator. A second copper trace is plated on the printed circuit board and is adapted for electrical connection to the ground terminal of the RF generator. The first spring connectors are electrically connected to the first trace and are positioned to make electrical contact with the back side of the piezoelectric crystal. The second spring connectors are electrically connected to the second trace and are positioned to make electrical contact with the front side of the piezoelectric crystal, so that the piezoelectric crystal is exited when the RF generator is in operation.

19 Claims, 5 Drawing Sheets

SPRING ELECTRICAL CONNECTORS FOR A MEGASONIC CLEANING SYSTEM

This application is a continuation-in-part of U.S. patent application Ser. No. 09/543,204, filed Apr. 5, 2000, now U.S. Pat. No. 6,222,305 B1, and also claims priority of U.S. provisional patent application No. 60/154,481, filed Sep. 17, 1999.

TECHNICAL FIELD

The present invention relates to electrical connectors and more particularly to a printed circuit board having a plurality of conductive spring connectors for applying a potential difference across a piezoelectric crystal used in a megasonic cleaning system.

BACKGROUND INFORMATION

It is well-known that sound waves in the frequency range of 0.4 to 2.0 megahertz (MHZ) can be transmitted into liquids and used to clean particulate matter from damage sensitive substrates. Since this frequency range is predominantly near the megahertz range, the cleaning process is commonly referred to as megasonic cleaning. Among the items that can be cleaned with this process are semiconductor wafers in various stages of the semiconductor device manufacturing process, disk drive media, flat panel displays and other sensitive substrates.

Megasonic acoustic energy is generally created by exciting a crystal with radio frequency AC voltage. The acoustical energy generated by the crystal is passed through an energy transmitting member and into the cleaning fluid. Frequently, the energy transmitting member is a wall of the vessel that holds the cleaning fluid. The crystal and its related components are referred to as a megasonic transducer. For example, U.S. Pat. No. 5,355,048, discloses a megasonic transducer comprised of a piezoelectric crystal attached to a quartz window by several attachment layers. The megasonic transducer operates at approximately 850 KHz. Similarly, U.S. Pat. No. 4,804,007 discloses a megasonic transducer in which energy transmitting members comprised of quartz, sapphire, boron nitride, stainless steel or tantalum are glued to a piezoelectric crystal using epoxy.

It is also known that piezoelectric crystals can be bonded to certain materials using indium. For example, U.S. Pat. No. 3,590,467 discloses a method for bonding a piezoelectric crystal to a delay medium using indium where the delay medium comprises materials such as glasses, fused silica and glass ceramic.

In many megasonic transducers of the prior art, the crystal is excited by soldering the active lead from the RF generator to a silver electrode layer that has been applied to the back of the crystal. Several problems exist with this arrangement. First, excessive heat can build up at the point of connection of the active lead to the silver electrode. This heat can cause the silver layer to delaminate from the piezoelectric crystal, thereby causing the transducer to fail. Second, air-backed piezoelectric transducers are designed to provide a uniform forward acoustic field. Solder points on the backside of the piezoelectric crystal can dampen the acoustic properties of the piezoelectric crystal, thereby causing an irregularity in the forward acoustic field. Third, once the active lead has been soldered to the piezoelectric crystal, there is no practical way of replacing a defective crystal without melting the solder.

SUMMARY OF THE INVENTION

Briefly, the present invention is a system for making electrical connections to a piezoelectric crystal in a megasonic transducer. The system comprises a printed circuit board member, one or more first spring connectors and one or more second spring connectors. The board member has a first copper trace plated on it that is adapted for electrical connection to the active terminal of an RF generator. A second copper trace is plated on the board member and is adapted for electrical connection to the ground terminal of the RF generator. The first spring connectors are electrically connected to the first trace and are positioned to make electrical contact with the back side of the piezoelectric crystal. The second spring connectors are electrically connected to the second trace and are positioned to make electrical contact with the front side of the piezoelectric crystal.

Each first spring connector comprises a first base button mechanically connected to the board member and electrically connected to the first trace, a first spring mechanically connected to the first base button, and a first top button mechanically connected to the first spring and positioned to electrically contact the back side the piezoelectric crystal. The first base button, the first spring, and the first top button are all electrically conductive.

Similarly, each second spring connector comprises a second base button mechanically connected to the board member and electrically connected to the second trace, a second spring mechanically connected to the second base button, and a second top button mechanically connected to the second spring and positioned to electrically contact the front side of the piezoelectric crystal. The second base button, the second spring, and the second top button are all electrically conductive.

In use, the board member is positioned inside a watertight housing with the back side of the piezoelectric crystal pressing against the top buttons of the first spring connectors. The top buttons of the second spring connectors press against a conductive layer that is in electrical contact with the front side of the piezoelectric crystal. A coaxial cable connects the RF generator to the board member. Since the first spring connectors are electrically connected to the first trace and the second spring connectors are electrically connected to the second trace, a potential difference is set up across the piezoelectric crystal so as to excite it at the frequency of the RF voltage supplied by the RF generator.

DESCRIPTION OF THE PREFERRED EMBODIMENTS

Figure 1:
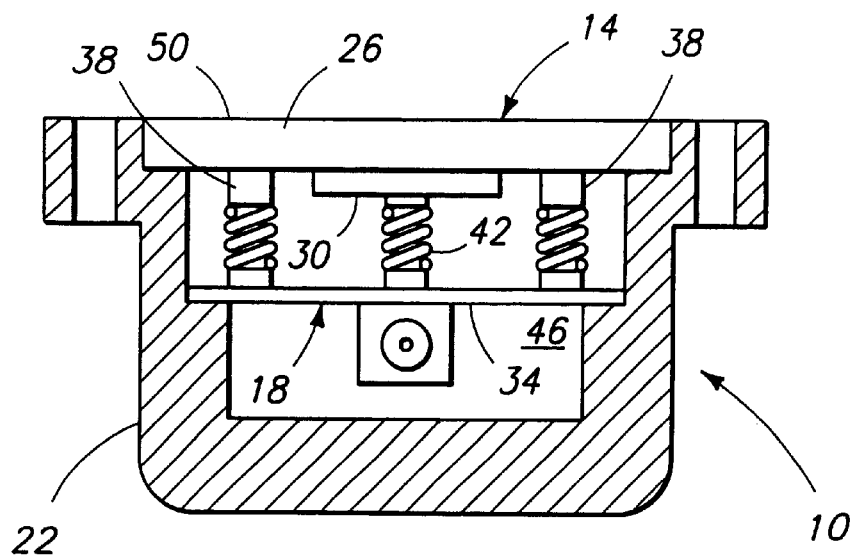
FIG. 1 is a cross-sectional view of an acoustic transducer assembly according to the present invention.

FIG. 1 illustrates a cross section of an acoustic transducer assembly 10 comprised of an acoustic transducer 14, a spring/button electrical connector board 18 and a housing 22. The transducer 14 comprises a resonator 26 which is bonded to a piezo crystal 30. The electrical connector board 18 comprises a printed circuit board (PCB) 34 which has a plurality of first spring/button connectors 38 and a plurality of second spring/button connectors 42 connected to it. The housing 22 is a case that encloses the electrical connector board 18 so that it is protected from the environment. The electrical connector board 18 and the acoustic transducer 14 sit in a cavity 46 inside the housing 22.

The resonator 26 forms part of a wall in the housing 22 that covers and seals the cavity 46. A surface 50 of the resonator 26 forms an external side of the acoustic transducer assembly 10. In the preferred embodiment, the acoustic transducer 14 is used to generate megasonic acoustic energy in a cleaning apparatus used to clean semiconductor wafers. The surface 50 will be in contact with the cleaning fluid used in the cleaning apparatus.

Figure 2:
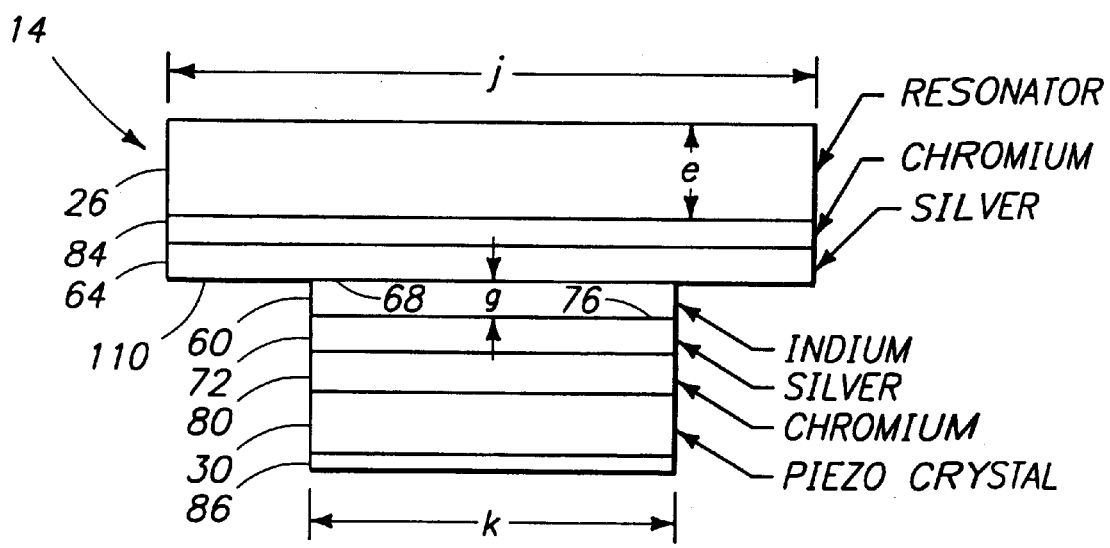
FIG. 2 is a side view of an acoustic transducer according to the present invention.

FIG. 2 illustrates that the acoustic transducer 14 comprises the piezoelectric crystal 30 attached to resonator 26 by an indium layer 60. In the preferred embodiment, a plurality of other layers are disposed between the piezoelectric crystal 30 and the resonator 26 to facilitate the attachment process. Specifically, a first metal layer 64 is present adjacent to a front surface 68 of the indium layer 60. A second metal layer 72 is present adjacent to a back surface 76 of the indium layer 60. A blocking layer 80 is positioned between the metal layer 72 and the piezoelectric crystal 30 to promote adhesion. In the preferred embodiment, the blocking layer 80 comprises a chromium-nickel alloy, and the metal layers 64 and 72 comprise silver. The blocking layer 80 has a minimum thickness of approximately 500 Å and the metal layer 72 has a thickness of approximately 500 Å.

In the preferred embodiment, the piezoelectric crystal 30 is comprised of lead zirconate titanate (PZT). However, the piezoelectric crystal 30 can be comprised of many other piezoelectric materials such as barium titanate, quartz or polyvinylidene fluoride resin (PVDF), as is well-known in the art. In the preferred embodiment, two rectangularly shaped PZT crystals are used in the transducer 14, and each PZT crystal is individually excited.

A blocking/adhesion layer 84 separates the metal layer 64 from the resonator 26. In the preferred embodiment, the blocking/adhesion layer 84 comprises a layer of nickel chromium alloy which is approximately 500 Å thick. However, other materials and/or thicknesses could also be used as the blocking layer 84. The function of the blocking layer 84 is to provide an adhesion layer for the metal layer 64. In the preferred embodiment, the metal layer 64 comprises silver and has a thickness of approximately 500 Å. However, other metals and/or thicknesses could be used for the metal layer 64. The function of the metal layer 64 is to provide a wetting surface for the molten indium.

An additional layer is also disposed on a back side of the piezoelectric crystal 30. Specifically, a metal layer 86 is positioned on the back side of the piezoelectric crystal 30 and covers substantially all of the surface area of the back side of the crystal 30. Generally, the layer 86 is applied to the piezoelectric crystal 30 by the manufacturer of the crystal. The layer 86 functions to conduct electricity from a set of the spring/button connectors shown in FIG. 1, so as to set up a voltage across the crystal 30. Preferably, the metal layer 86 comprises silver, nickel or another electrically conductive layer.

In the preferred embodiment, the indium layer 60 comprises pure indium (99.99%) such as is commercially available from Arconium or Indalloy. However, Indium alloys containing varying amounts of impurity metals can also be used, albeit with less satisfactory results. The benefit of using pure indium and its alloys is that indium possesses excellent shear properties that allow dissimilar materials with different coefficients of expansion to be attached together and experience thermal cycling without damage to the attached materials.

In the preferred embodiment, the resonator 26 is a piece of sapphire ($Al_2O_3$). Preferably, the sapphire is high grade having a designation of 99.999% (5,9s+purity). However, other materials, such as stainless steel, tantalum, aluminum, silica compounds, such as quartz, ceramics and plastics, can also function as the resonator 26. The purpose of the resonator 26 is to separate (isolate) the piezoelectric crystal 30 from the fluid used in the cleaning process, so that the fluid does not damage the crystal 30. Thus, the material used as the resonator 26 is usually dictated, at least in part, by the nature of the fluid. The resonator 26 must also be able to transmit the acoustic energy generated by the crystal 30 into the fluid. Sapphire is a desirable material for the resonator 26 when the items to be cleaned by the megasonic cleaning apparatus require parts per trillion purity. For example, semiconductor wafers require this type of purity.

In the preferred embodiment, the resonator 26 has a thickness "e" which is preferably a multiple of one-half of the wavelength of the acoustic energy emitted by the piezoelectric crystal 30, so as to minimize reflectance problems. For example, "e" is approximately six millimeters for sapphire and acoustic energy of about 925 KHz.

FIG. 3($a$) illustrates the spring/button electrical connector board 18 in more detail. Each first spring/button connector 38 comprises an upper (or top) silver button 90 and a lower (or base) silver button 94. The upper silver button 90 and the lower silver button 94 are attached to a plated silver spring 97. Preferably, the buttons 90 and 94 just snap into the spring 97 The lower button 94 is soldered to the printed circuit board (PCB) 34 so that the connector 38 can provide an electrical connection to the acoustic transducer 14. The upper silver button 90 has a thickness "t" of about 0.15 inches.

Similarly, each second spring/button connector 42 comprises an upper silver button 98 and a lower silver button 102. The upper (or top) silver button 98 and the lower (or base) silver button 102 are attached to a silver plated spring 106. Preferably, the buttons 98 and 102 just snap into the spring 106. The lower button 102 is soldered to the PCB 34 so that the connector 42 can provide an electrical connection to the acoustic transducer 14. The upper silver button 98 has a thickness "r" of about 0.10 inches. Generally, the thickness "t" is greater than the thickness "r" because the first spring/button connector 38 has to extend farther up to make contact with the acoustic transducer 14 than does the second spring/button connector 42 (see FIGS. 1 and 2).

In the preferred embodiment, the springs 97 and 106 each have the same length "s" which, preferably, is in the range of 0.5 to 0.75 inches. However, other dimensions for "t", "r" and "s" can be used. Preferably, the springs 97 and 106 are comprised of silver plated beryllium copper alloy, and the buttons 90, 94, 98 and 102 are pure silver. However, other electrically conductive materials, such as gold, can be used. In alternate embodiments, the first spring/button connector 38 can be made longer than the second spring/button connector 42 in other ways. For example, the thicknesses of the buttons 90 and 98 can be the same but the length of the spring 97 could be greater than the length of the spring 106.

What really matters is that the height (measured in the direction of "s") of the first spring/button connector 38 must be greater than the height of the second spring/button connector 42, in order that the first spring/button connector 38 can reach the step region 110. Stated more generally, the height of the first spring/button connector 38 is different than the height of the second spring/button connector 42.

Figure 3A:
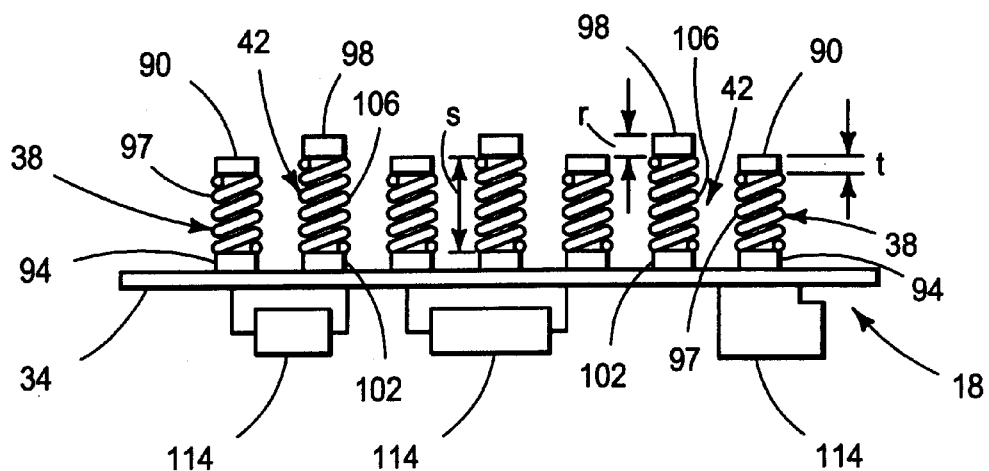
FIG. 3(a) is side view of a spring/button electrical connector board according to the present invention.
Figure 3B:
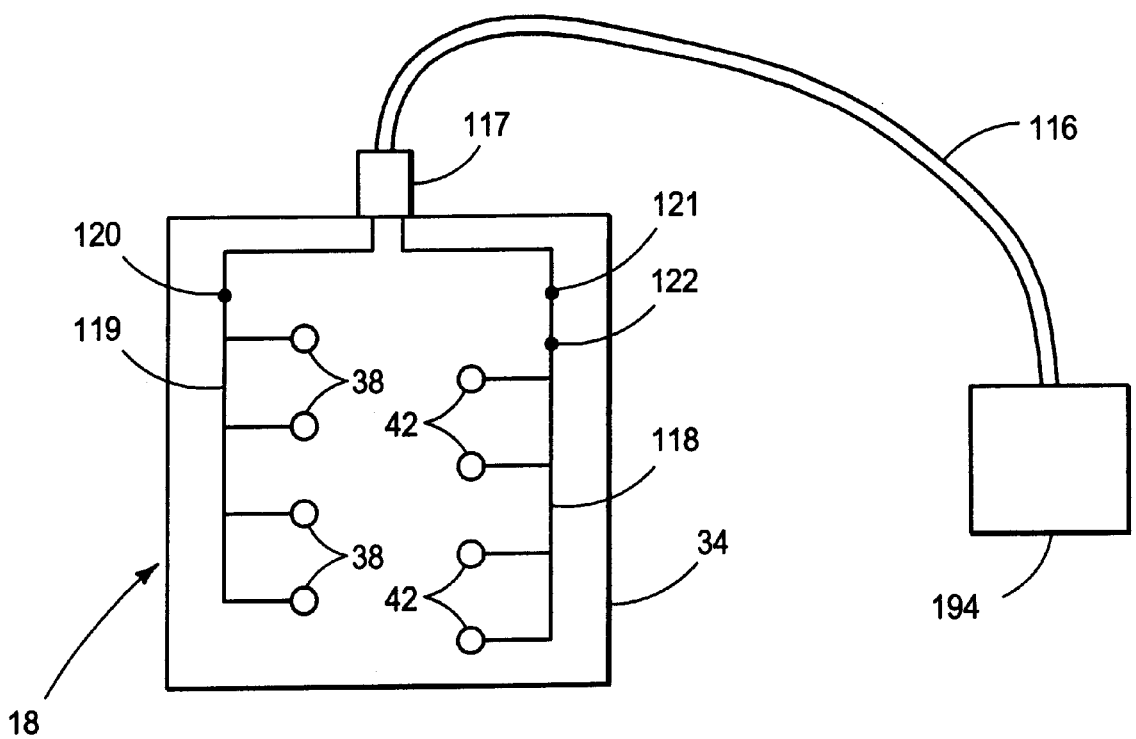
FIG. 3(b) is a top view of the spring/button electrical connector board according to the present invention.
Figure 6:
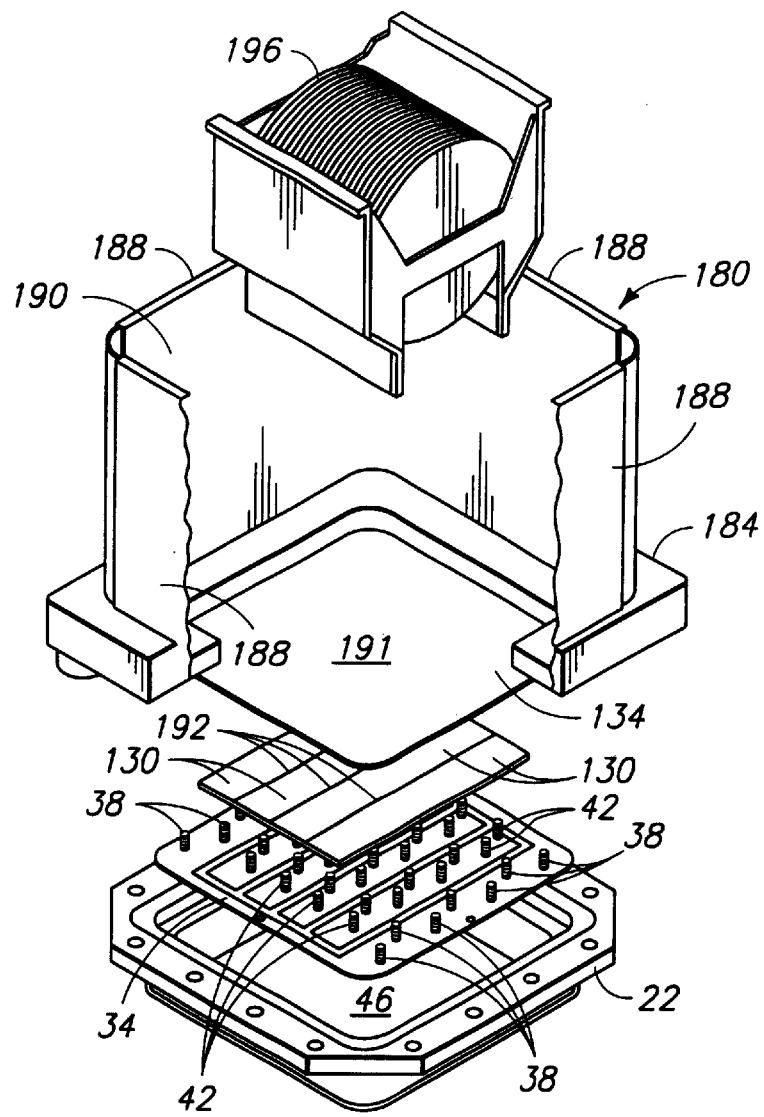
FIG. 6 is an exploded view of a megasonic cleaning system according to the present invention.
Figure 7:
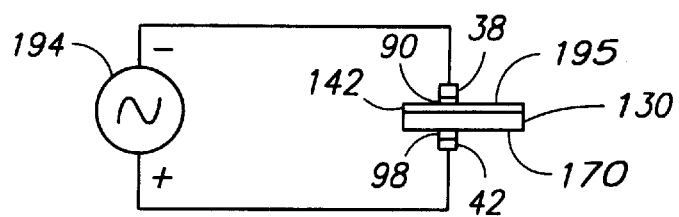
FIG. 7 is a schematic circuit diagram of the present invention.

FIG. 3(b) illustrates that a radio frequency (RF) generator 194 (described later with respect to FIGS. 6 and 7 provides an alternating current (AC) voltage to the PCB 34. The RF generator 194 is connected to the PCB 34 by a coaxial cable 116. The coaxial cable 116 plugs into a standard BNC connector 117 on the PCB 34. A trace 118 connects the active (or driven) conductor in the coaxial cable 116 to the connectors 42. The connectors 42 are all electrically connected in parallel by the trace 118 to the active conductor. Similarly, a trace 119 connects the ground (or shield) conductor in the coaxial cable 116 to the connectors 38. The connectors 38 are all electrically connected in parallel by the trace 119 to the ground conductor. Preferably, the traces 118 and 119 are comprised of "heavy" (two ounce) copper plating to handle the high RF wattage.

Examination of FIG. 2 shows that in the acoustic transducer 14, the layers 26, 84 and 64 have a greater length "j" than the length "k" of the layers 60, 72, 80, 30 and 86. This creates a step-region 110 on the silver layer 64 that can be contacted by the upper buttons 90 of the spring/button connectors 38. Since the layers 64, 60, 72 and 80 are all electrically conductive and in contact with each other, and since the layer 80 covers the front surface (or face) of the crystal 30, the buttons 90 are said to make electrical contact with the front face of the crystal 30. The upper buttons 98 of the spring/button connectors 42 make electrical contact with the silver layer 86. Since the silver layer 86 covers the back surface (or face) of the crystal 30, the buttons 98 are said to make electrical contact with the back face of the crystal 30.

The purpose of the spring/button connectors 38 and 42 is to create a voltage difference across the piezoelectric crystal 30 so as to excite it at the frequency of the RF voltage supplied by the RF generator. The connectors 38 connect the metal layer 64 to the RF generator. The connectors 42 connect the layer 86 to the RF generator. The RF generator delivers a RF alternating current to the piezoelectric crystal 30 via the connectors 38 and 42. Preferably, this is a 925 KHz signal, at 600 watts of power. The effective power in the piezoelectric crystal 30 is approximately 15.5 watts/cm². The effective power in the piezoelectric crystal 30 is defined as the forward power into the crystal 24 minus the reflected power back into the RF generator. Thus, the step-region 110, and the spring/button connectors 38 and 42, allow a voltage to be set up across the piezoelectric crystal 30 without the need for soldering discrete leads to the layers 64 and 86.

There are several advantages to using the spring/button electrical connector board 18. First, the spring/button connectors 38 and 42 do not "back load" the crystal 30 as can happen when electrical leads are soldered directly to the back of the crystal 30. Second, the connectors 38 and 42 do not cause wear on the crystal 30 or cause heat, because many of the connectors 42 can be used. This reduces the current per connection and also reduces the resistance the current travels through. Typically, one connector 42 is used for each 100 watts of current, although other numbers can be used. Third, the spring/button electrical connector board 18. spring/button electrical connector board 18 can be easily disassembled for repair without the use of a soldering iron.

In FIG. 3(a), a plurality of electrical components 114, such as capacitors and/or inductors, are shown. These are optional components that can be used to balance the impedance between the RF input and the spring output. More specifically, because standard commercially RF power amplifiers are configured for driving a fifty ohm load, it is desirable to have the transducer 14 look like a 50 ohm load to the power source. The preferred way to accomplish this is to have an acoustic engineer design the transducer 14 to operate at the desired frequency and at the desired 50 ohm drive. In this case, the components 114 are not needed.

An alternate solution is to passively match the load of the transducer 14 to 50 ohms by adding capacitors in series and/or inductors in parallel between the leads 118 and 119. The components 114 depict a passive load balancing configuration of this type. For example, a capacitor could be connected between the nodes 121 and 122 shown in FIG. 3(b). Similarly, the load of the transducer 14 can be passively matched to 50 ohms by adding inductors in parallel between the leads 118 and 119, such as by connecting an inductor between the nodes 120 and 121. Alternatively, a passively matched load can be achieved by using a combination of capacitors and inductors, or by using some other combination of circuit elements.

Figure 4:
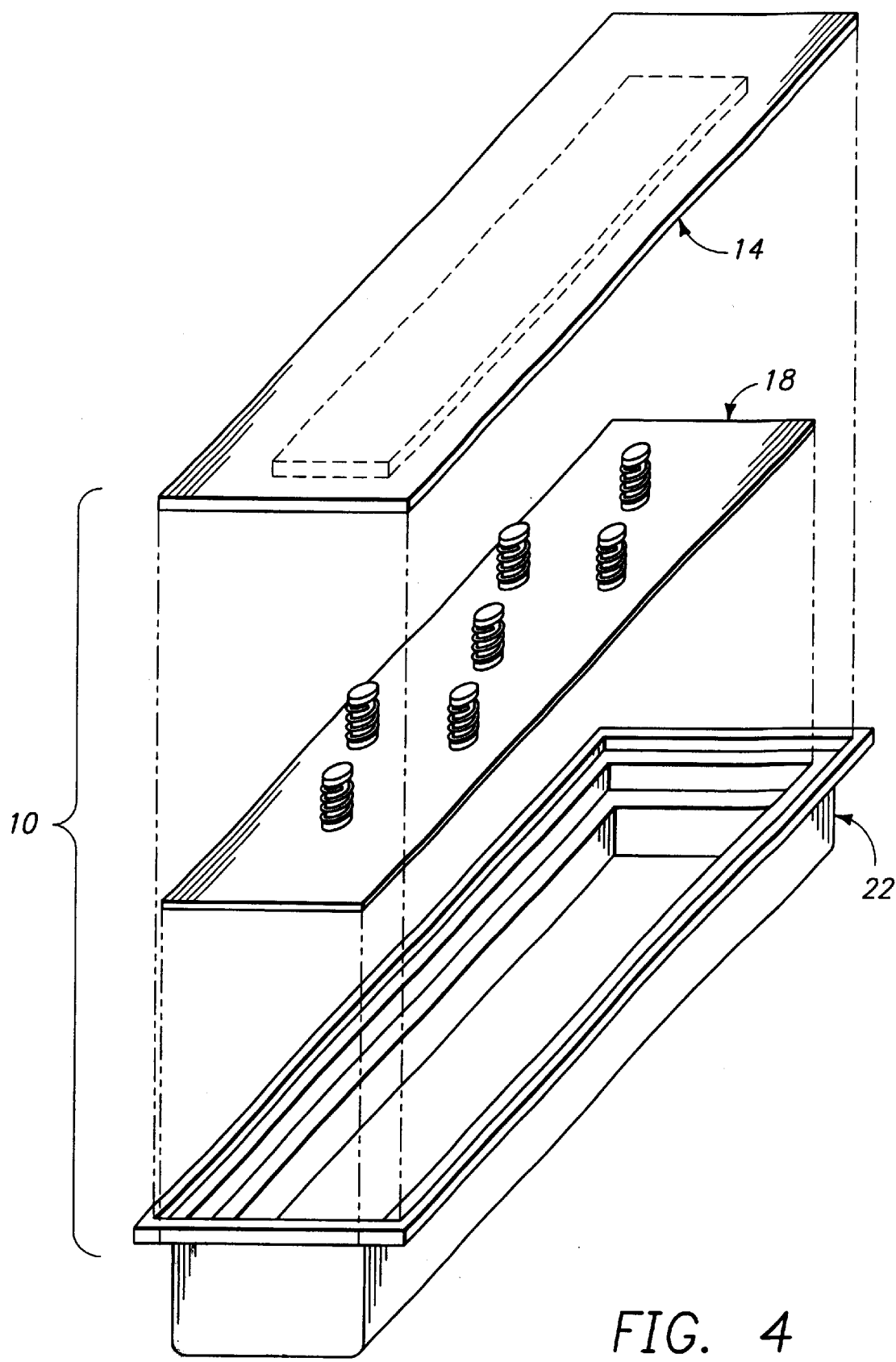
FIG. 4 is an exploded view of the acoustic transducer assembly according to the present invention.

FIG. 4 illustrates the way the acoustic transducer 14, the spring/button electrical connector board 18 and the housing 22 fit together to form the acoustic transducer assembly 10.

The acoustic transducer 14 is prepared as follows (using the preferred materials described previously): Assuming that the resonator 26 is sapphire, the surface of the sapphire that will be adjacent to the layer 84 is cleaned by abrasive blasting or chemical or sputter etching. The blocking/adhesion layer 84 is then deposited on the resonator 26 by physical vapor deposition ("PVD"), such as argon sputtering. A plating technique could also be used. The silver layer 64 is then deposited on the chromium blocking/adhesive layer 84 using argon sputtering. A plating technique could also be used.

The piezoelectric crystal 30 is usually purchased with the layers 86 already applied to it. The blocking layer 80 and the metal layer 72 are deposited on the crystal 30 by plating or physical vapor deposition.

The resonator 26 and the piezoelectric crystal 30 are both heated to approximately 200° C., preferably by placing the resonator 26 and the crystal 30 on a heated surface such as a hot-plate. When both pieces have reached a temperature of greater than 160° C., solid indium is rubbed on the surfaces of the resonator 26 and the crystal 30 which are to be attached. Since pure indium melts at approximately 157° C., the solid indium liquefies when it is applied to the hot surfaces, thereby wetting the surfaces with indium. It is sometimes advantageous to add more indium at this time by using the surface tension of the indium to form a "puddle" of molten indium.

The resonator 26 and the piezoelectric crystal 30 are then pressed together so that the surfaces coated with indium are in contact with each other, thereby forming the transducer 14. The newly formed transducer 14 is allowed to cool to room temperature so that the indium solidifies. Preferably, the solid indium layer has a thickness "g" which is just sufficient to form a void free bond (i.e. the thinner the better). In the preferred embodiment, "g" is approximately one mil (0.001 inches). Thicknesses up to about 0.01 inches could be used, but the efficiency of acoustic transmission drops off when the thickness "g" is increased.

Preferably, the transducer 14 is allowed to cool with the piezoelectric crystal 30 on top of the resonator 26 and the force of gravity holding the two pieces together.

Alternatively, a weight can be placed on top of the piezoelectric crystal 30 to aide in the bonding of the indium. Another alternative is to place the newly formed transducer 14 in a clamping fixture.

Once the transducer 14 has cooled to room temperature, any excess indium that has seeped out from between the piezoelectric crystal 30 and the resonator 26, is removed with a tool or other means.

Figure 5:
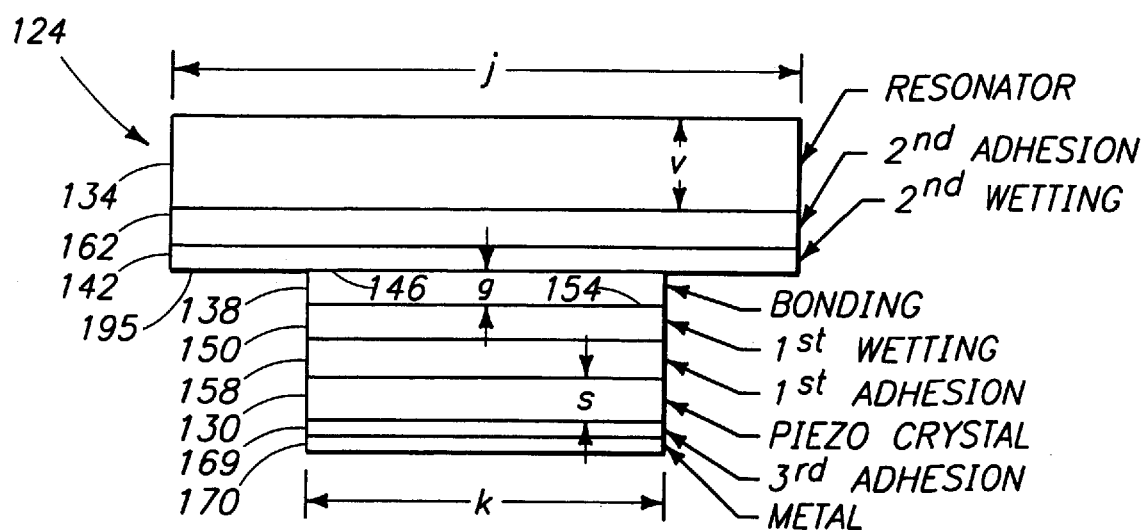
FIG. 5 is a side view of an acoustic transducer according to the present invention.

FIG. 5 illustrates a preferred embodiment of an acoustic transducer system 124 in which the resonator can be one of several chemically inert materials. These materials include sapphire, quartz, silicon carbide, silicon nitride and ceramics. The transducer system 124 shown in FIG. 5 is similar to the transducer 14 shown in FIG. 2. However, several of the attachment layers used in the transducer system 124 are different.

In FIG. 5, the acoustic transducer system 124 comprises a piezoelectric crystal 130 attached to a resonator 134 by a bonding layer 138. A plurality of attachment layers are disposed between the piezoelectric crystal 130 and the resonator 134 to facilitate the attachment process. Specifically, a second wetting layer 142 is present adjacent to a front surface 146 of the bonding layer 138. A first wetting layer 150 is present adjacent to a back surface 154 of the bonding layer 138. A first adhesion layer 158 is positioned between the first wetting layer 150 and the piezoelectric crystal 130 to facilitate the mechanical adhesion of the bonding layer 138 to the crystal 130.

In the preferred embodiment, the first adhesion layer 158 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the first adhesion layer 158. Nickel 400™ and MONEL™ are copper nickel alloys comprised of 32% copper and 68% nickel.

Preferably, the wetting layers 142 and 150 comprise silver. The wetting layers 142 and 150 each have a thickness of approximately 5000 Å. However, other metals and/or thicknesses could be used for the wetting layers 142 and 150. The function of the wetting layers 142 and 150 is to provide a wetting surface for the molten indium, meaning that the layers 142 and 150 help the bonding (indium) layer 138 adhere to the first adhesion layer 158 and a second adhesion layer 162, respectively. It is thought that the silver in the wetting layers 142 and 150 forms an alloy with the indium, thereby helping the bonding layer 138 adhere to the adhesion layers 158 and 162. The transducer system 124 includes a step-region 195 in the wetting layer 142 which is exactly analogous to the step-region 110 described previously with respect to FIG. 2.

In the preferred embodiment, the piezoelectric crystal 130 is identical to the piezoelectric crystal 30 already described, and is comprised of lead zirconate titanate (PZT). However, many other piezoelectric materials such as barium titanate, quartz or polyvinylidene fluoride resin (PVDF), may be used as is well-known in the art. In the preferred embodiment, four rectangularly shaped PZT crystals are used in the transducer 14 (shown in FIG. 6), and each PZT crystal is individually excited. However, other numbers of the crystals 130 can be used, including between one and sixteen of the crystals 130, and other shapes, such as round crystals, could be used.

The second adhesion layer 162 separates the second wetting layer 142 from the resonator 134. In the preferred embodiment, the adhesion layer 162 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the second adhesion layer 162.

The function of the first adhesion layer 158 is to form a strong bond between the bonding (indium) layer 138 and the piezoelectric crystal 130. As noted previously, the wetting layer 150 forms an alloy with the indium in the bonding layer 138, thereby permitting the adhesion layer 158 to bond with the bonding layer 138. Similarly, the function of the second adhesion layer 162 is to form a strong bond between the bonding (indium) layer 138 and the resonator 134. The wetting layer 142 forms an alloy with the indium in the bonding layer 138, thereby permitting the adhesion layer 162 to bond with the bonding layer 138. Additionally, the first adhesion layer 158 needs to be electrically conductive in order to complete the electrical path from the step region 195 to the surface of the piezoelectric crystal 130. Furthermore, the adhesion layers 158 and 162 may prevent (block) the indium in the bonding layer 138 from reacting with the crystal 130 and/or the resonator 134, respectively.

An additional two layers are disposed on a back side of the piezoelectric crystal 130 (i.e. on the side facing away from the resonator 134). Specifically, a third adhesion layer 169 and a metal layer 170 are positioned on the back side of the piezoelectric crystal 130. The layers 169 and 170 cover substantially all of the surface area of the back side of the crystal 130. In the preferred embodiment, the third adhesion layer 169 comprises an approximately 5000 Å thick layer of an alloy comprised of chrome and a nickel copper alloy, such as the alloys marketed under the trademarks Nickel 400™ or MONEL™. However, other materials and/or thicknesses could also be used as the third adhesion layer 169. The function of the third adhesion layer 169 is to promote adhesion of the metal layer 170 to the crystal 130.

Preferably, the metal layer 170 comprises silver, although other electrically conductive metals such as nickel could also be used. Generally, the crystal 130 is obtained from commercial sources without the layers 169 and 170. The layers 169 and 170 are then applied to the piezoelectric crystal 130 using a sputtering technique such as physical vapor deposition (PVD). The layer 170 functions as an electrode to conduct electricity from a set of the spring/button connectors shown in FIG. 1, so as to set up a voltage across the crystal 130. Since the third adhesion layer 169 is also electrically conductive, both of the layers 169 and 170 actually function as an electrode.

In the preferred embodiment, the bonding layer 138 comprises pure indium (99.99%) such as is commercially available from Arconium or Indalloy. However, indium alloys containing varying amounts of impurity metals can also be used, albeit with less satisfactory results. The benefit of using indium and its alloys is that indium possesses excellent shear properties that allow dissimilar materials with different coefficients of expansion to be attached together and experience thermal cycling (i.e. expansion and contraction at different rates) without damage to the attached materials or to the resonator 134. The higher the purity of the indium, the better the shear properties of the system 124 will be. If the components of the acoustic transducer system 124 have similar coefficients of expansion, then less pure indium can be used because shear factors are less of a concern. Less pure indium (i.e. alloys of indium) has a higher melting point then pure indium and thus may be able to tolerate more heat.

Depending upon the requirements of a particular cleaning task, the composition of the resonator 134 is selected from a group of chemically inert materials. For example, inert materials that work well as the resonator 134 include sapphire, quartz, silicon carbide, silicon nitride and ceramics. One purpose of the resonator 134 is to separate (isolate) the piezoelectric crystal 130 from the fluid used in the cleaning process, so that the fluid does not damage the crystal 130. Additionally, it is unacceptable for the resonator 134 to chemically react with the cleaning fluid. Thus, the material used as the resonator 134 is usually dictated, at least in part, by the nature of the cleaning fluid. Sapphire is a desirable material for the resonator 134 when the items to be cleaned by the megasonic cleaning apparatus require parts per trillion purity. For example, semiconductor wafers require this type of purity. A hydrogen fluoride (HF) based cleaning fluid might be used in a cleaning process of this type for semiconductor wafers.

The resonator 134 must also be able to transmit the acoustic energy generated by the crystal 130 into the fluid. Therefore, the acoustic properties of the resonator 134 are important. Generally, it is desirable that the acoustic impedance of the resonator 134 be between the acoustic impedance of the piezoelectric crystal 130 and the acoustic impedance of the cleaning fluid in the fluid chamber 190 (shown in FIG. 6). Preferably, the closer the acoustic impedance of the resonator 134 is the acoustic impedance of the cleaning fluid, the better.

In one preferred embodiment, the resonator 134 is a piece of synthetic sapphire (a single crystal substrate of $Al_2O_3$). Preferably, the sapphire is high grade having a designation of 99.999% (5 9s+purity). When synthetic sapphire is used as the resonator 134, the thickness "v", illustrated in FIG. 5 is approximately six millimeters. It should be noted that other forms of sapphire could be used as the resonator 134, such as rubies or emeralds. However, for practical reasons such as cost and purity, synthetic sapphire is preferred. Additionally, other values for the thickness "v" can be used.

In the preferred embodiment, the thickness "v" of the resonator 134 is a multiple of one-half of the wavelength of the acoustic energy emitted by the piezoelectric crystal 130, so as to minimize reflectance problems. For example, "v" is approximately six millimeters for sapphire and acoustic energy of approximately 925 KHz. The wavelength of acoustic energy in the resonator 134 is governed by the relationship shown in equation 1 below:

$$\lambda = V_L/2f \quad (1)$$

where, $V_L$=the velocity of sound in the resonator 134 (in mm/msec), f=the natural frequency of the piezoelectric crystal 130 (in MHz)

$\lambda$=the wavelength of acoustic energy in the resonator 134.

From equation 1, it follows that when the composition of the resonator changes or when the natural resonance frequency of the crystal 130 changes, the ideal thickness of the resonator 134 will change. Therefore, in all of the examples discussed herein, a thickness "v" which is a multiple of one-half of the wavelength $\lambda$ could be used.

In another preferred embodiment, the resonator 134 is a piece of quartz ($SiO_2$-synthetic fused quartz). Preferably, the quartz has a purity of 99.999% (5 9s+purity). When quartz is used as the -resonator 134, the thickness "v", illustrated in FIG. 5 is approximately three to six millimeters.

In another preferred embodiment, the resonator 134 is a piece of silicon carbide (SiC). Preferably, the silicon carbide has a purity of 99.999% (5 9s+purity, semiconductor grade). When silicon carbide is used as the resonator 134, the thickness "v", illustrated in FIG. 5 is approximately six millimeters.

In another preferred embodiment, the resonator 134 is a piece of silicon nitride. Preferably, the silicon nitride has a purity of 99.999% (5 9s+purity, semiconductor grade). When silicon nitride is used as the resonator 134, the thickness "v", illustrated in FIG. 5 is approximately six millimeters.

In another preferred embodiment, the resonator 134 is a piece of ceramic material. In this application, the term ceramic means alumina ($Al_2O_3$) compounds such as the material supplied by the Coors Ceramics Company under the designation Coors AD-998. Preferably, the ceramic material has a purity of at least 99.8% $Al_2O_3$. When ceramic material is used as the resonator 134, the thickness "v", illustrated in FIG. 5 is approximately six millimeters.

The acoustic transducer system 124 illustrated in FIG. 5 is prepared by the following method: Assuming that the resonator 134 is sapphire, the surface of the sapphire that will be adjacent to the adhesion layer 162 is cleaned by abrasive blasting or chemical or sputter etching. The adhesion layer 162 is then deposited on the resonator 134 using a physical vapor deposition ("PVD") technique, such as argon sputtering. More specifically, the chrome and nickel copper alloy (e.g. Nickel 400™ or MONEL™) that comprise the layer 162 are co-sputtered onto to the resonator 134 so that the layer 162 is comprised of approximately 50% chrome and 50% nickel copper alloy. The wetting (silver) layer 142 is then deposited on the adhesion layer 162 using argon sputtering. A plating technique could also be used in this step.

The piezoelectric crystal 130 is preferably purchased without any electrode layers deposited on its surfaces. The third adhesion layer 169 is then deposited on the crystal 130 using a PVD technique, such as argon sputtering. More specifically, the chrome and nickel copper alloy that comprise the layer 169 are co-sputtered onto to the crystal 130 so that the layer 169 is comprised of approximately 50% chrome and 50% nickel copper alloy (e.g. Nickel 400™ or MONEL™). The electrode (silver) layer 170 is then deposited on the adhesion layer 169 using argon sputtering. A plating technique could also be used in this step.

Similarly, the first adhesion layer 158 is deposited on the opposite face of the crystal 130 from the third adhesion layer 169 using a PVD technique like argon sputtering. More specifically, the chrome and nickel copper alloy that comprise the layer 158 are co-sputtered onto to the crystal 130 so that the layer 158 is comprised of approximately 50% chrome and 50% nickel copper alloy. The wetting (silver) layer 150 is then deposited on the adhesion layer 158 using argon sputtering. A plating technique could also be used in this step.

The resonator 134 and the piezoelectric crystal 130 are both heated to approximately 200° C., preferably by placing the resonator 134 and the crystal 130 on. a heated surface such as a hot-plate. When both pieces have reached a temperature of greater than 160° C., solid indium is rubbed on the surfaces of the resonator 134 and the crystal 130 which are to be attached. Since pure indium melts at approximately 157° C., the solid indium liquefies when it is applied to the hot surfaces, thereby wetting the surfaces with indium. It is sometimes advantageous to add more indium at this time by using the surface tension of the indium to form a "puddle" of molten indium.

The resonator 134 and the piezoelectric crystal 130 are then pressed together so that the surfaces coated with indium are in contact with each other, thereby forming the transducer system 124. The newly formed transducer system 124 is allowed to cool to room temperature so that the indium solidifies. Preferably, the bonding (indium) layer 138 has a thickness "g" which is just sufficient to form a void free bond. In the preferred embodiment, "g" is approximately one mil (0.001 inches). It is thought that the thickness "g" should be as small as possible in order to maximize the acoustic transmission, so thicknesses less than one mil might be even more preferable. Thicknesses up to about 0.01 inches could be used, but the efficiency of acoustic transmission drops off when the thickness "g" is increased.

Preferably, the transducer system 124 is allowed to cool with the piezoelectric crystal 130 on top of the resonator 134 and the force of gravity holding the two pieces together. Alternatively, a weight can be placed on top of the piezoelectric crystal 130 to aide in the bonding of the indium. Another alternative is to place the newly formed transducer system 124 in a clamping fixture.

Once the transducer system 124 has cooled to room temperature, any excess indium that has seeped out from between the piezoelectric crystal 130 and the resonator 134, is removed with a tool or other means.

FIG. 6 illustrates a megasonic cleaning system 180 that utilizes the acoustic transducer system 124 (or the acoustic transducer 14). The cleaning solution is contained within a tank 184. In the preferred embodiment, the tank 184 is square-shaped and has four vertical sides 188. The resonator 134 forms part of the bottom surface of the tank 184. Other shapes can be used for the tank 184, and in other embodiments, the resonator 134 can form only a portion of the bottom surface of the tank 184.

A fluid chamber 190 is the open region circumscribed by the sides 188. Since the sides 188 do not cover the top or bottom surfaces of the tank 184, the sides 188 are said to partially surround the fluid chamber 190. The fluid chamber 190 holds the cleaning solution so the walls 188 and the resonator 134 must make a fluid tight fit to prevent leakage. The resonator 134 has an interface surface 191 which abuts the fluid chamber 190 so that the interface surface 134 is in contact with at least some of the cleaning solution when cleaning solution is present in the fluid chamber 190. Obviously, the interface surface 191 is only in contact with the cleaning solution directly adjacent to the surface 191 at any point in time.

In the preferred embodiment shown in FIG. 6, four piezoelectric crystals 130 are used. In a typical preferred embodiment, each of the crystals is a rectangle having dimensions of 1 inch (width)×6 inch (length "k" in FIG. 5)×0.10 inch (thickness "s" in FIG. 5). Since the natural frequency of the crystal changes with thickness, reducing the thickness will cause the natural frequency of the crystal to be higher. As was indicated previously, other numbers of crystals can be used, other shapes for the crystals can be used and the crystals can have other dimensions such as 1.25×7×0.10 inches or 1.5×8×0.10 inches. Each of the crystals 130 are attached to the resonator 134 by the plurality of layers described previously with respect to FIG. 5. A gap 192 exists between each adjacent crystal 130 to prevent coupling of the crystals.

The power for driving the crystals 130 is provided by a radiofrequency (RF) generator 194 (shown in FIG. 7). The electrical connections between the RF generator 194 and the crystals 130 are provided by the plurality of first spring/button connectors 38 and the plurality of second spring/button connectors 42, as was explained previously with respect to FIGS. 1 and 3. The plurality of second spring/button connectors 42 provide the active connection to the RF generator 194 and the plurality of first spring/button connectors 38 provide the ground connection to the RF generator 194.

The transducer system 124 includes the step-region 195 (shown in FIG. 5) which is exactly analogous to the step-region 110 described previously with respect to FIG. 2. The step region 195 is a region on the second wetting layer 142 that can be contacted by the upper buttons 90 of the spring/button connectors 38. Since all of the layers between the second wetting layer 142 and the crystal 130 are electrically conductive (i.e. the layers 138, 150 and 158), contact with the step region 195 is equivalent to contact with the surface front surface of the crystal 130. The upper buttons 98 of the spring/button connectors 42 make electrical contact with the metal layer 170 to complete the circuit for driving the PZT crystal 130. This circuit is represented schematically in FIG. 7.

Referring to FIG. 6, the printed circuit board (PCB) 34 and the piezoelectric crystal 130 are positioned in a cavity 46 and are surrounded by the housing 22 as was described previously with respect to FIG. 1. A plurality of items 196 to be cleaned are inserted through the top of the tank 184.

The acoustic transducer system 124 (illustrated in FIG. 5) functions as described below. It should be noted that the transducer 14 (illustrated in FIG. 2) works in the same manner as the acoustic transducer system 124. However, for the sake of brevity, the components of the system 124 are referenced in this discussion.

A radiofrequency (RF) voltage supplied by the RF generator 194 creates a potential difference across the piezoelectric crystal 130. Since this is an AC voltage, the crystal 130 expands and contracts at the frequency of the RF voltage and emits acoustic energy at this frequency. Preferably, the RF voltage applied to the crystal 130 has a frequency of approximately 925 KHZ. However, RF voltages in the frequency range of approximately 0.4 to 2.0 MHZ can be used with the system 124, depending on the thickness and natural frequency of the crystal 130. A 1000 watt RF generator such as is commercially available from Dressler Industries of Strohlberg, Germany is suitable as the RF generator 194.

In the preferred embodiment, only one of the crystals 130 is driven by the RF generator at a given time. This is because each of the crystals 130 have different natural frequencies. In the preferred embodiment, the natural frequency of each crystal 130 is determined and stored in software. The RF generator then drives the first crystal at the natural frequency indicated by the software for the first crystal. After a period of time (e.g. one millisecond), the RF generator 194 stops driving the first crystal and begins driving the second crystal at the natural frequency indicated by the software for the second crystal 130. This process is repeated for each of the plurality of crystals. Alternatively, the natural frequencies for the various crystals 130 can be approximately matched by adjusting the geometry of the crystals, and then driving all of the crystals 130 simultaneously. It should be noted that each of the crystals 130 needs a separate connector board 18 (shown in FIG. 3(b)), so that the individual crystal 130 can be driven by the RF generator 194 without driving the other crystals 130.

Most of the acoustic energy is transmitted through all of the layers of the system 124 disposed between the crystal 130 and the resonator 134, and is delivered into the cleaning fluid. However, some of the acoustic energy generated by the piezoelectric crystal 130 is reflected by some or all of these layers. This reflected energy can cause the layers to heat up, especially as the power to the crystal is increased.

In the present invention, the bonding layer 138 has an acoustic impedance that is higher than the acoustic impedance of other attachment substances, such as epoxy. This reduces the amount of reflected acoustic energy between the resonator 134 and the bonding layer 138. This creates two advantages in the present invention. First, less heat is generated in the transducer system, thereby allowing more RF power to be applied to the piezoelectric crystal 130. For example, in the transducer system illustrated in FIG. 5, 25 to 30 watts/cm$^2$ can be applied to the crystal 130 (for an individually excited crystal) without external cooling. Additionally, the system 124 can be run in a continuous mode without cooling (e.g. 30 minutes to 24 hours or more), thereby allowing better cleaning to be achieved. In contrast, prior art systems use approximately 7 to 8 watts/cm$^2$, without external cooling. Prior art megasonic cleaning systems that operate at powers higher than 7 to 8 watts/cm$^2$ in a continuous mode require external cooling of the transducer.

Second, in the present invention, the reduced reflectance allows more power to be delivered into the fluid, thereby reducing the amount of time required in a cleaning cycle. For example, in the prior art, a cleaning cycle for sub 0.5 micron particles generally requires fifteen minutes of cleaning time. With the present invention, this time is reduced to less than one minute for many applications. In general, the use of the bonding (indium) layer 138 permits at least 90 to 98% of the acoustic energy generated by the piezoelectric crystal 130 to be transmitted into the cleaning fluid when the total power inputted to the piezoelectric crystal 130 is in the range of 400 to 1000 watts (e.g. 50 watts/cm$^2$ for a crystal 130 having an area of 20 cm$^2$). In the preferred embodiment, the bonding (indium) layer 138 attenuates the acoustic energy that is transmitted into the volume of cleaning fluid by no more than approximately 0.5 dB. It is believed that the system 124 can be used with power as high as 5000 watts. In general, the application of higher power levels to the piezoelectric crystal 130 results in faster cleaning times. It may also lead to more thorough cleaning.

Table 1 below indicates the power levels that can be utilized when the indicated materials are used as the resonator 134 in the system 124. The input wattage (effective power) is defined as the forward power into the crystal 130 minus the reflected power back into the RF generator 194. As indicated above, the system 124 allows at least approximately 90 to 98% of the input wattage to be transmitted into the cleaning solution.

TABLE 1

| Resonator | Input Wattage/cm$^2$ |
| --- | --- |
| Quartz | 12.5 watts/cm$^2$ |
| Silicon carbide or silicon nitride | 20 watts/cm$^2$ |
| Stainless steel | 25 watts/cm$^2$ |
| Ceramic | 40 watts/cm$^2$ |
| Sapphire | 50 watts/cm$^2$ |

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

We claim:

1. A system for making electrical connections to a piezoelectric crystal comprising:

a board member having a first trace adapted for electrical connection to an active terminal of an RF generator and a second trace adapted for electrical connection to the ground terminal of the RF generator;

at least one first spring connector attached to the board member, the first spring connector comprising a first base button mechanically connected to the board member and electrically connected to the first trace, a first spring mechanically connected to the first base button, and a first top button mechanically connected to the first spring and positioned to electrically contact a first face of a piezoelectric crystal, the first base button, the first spring, and the first top button each being electrically conductive; and at least one second spring connector attached to the board member, the second spring connector comprising a second base button mechanically connected to the board member and electrically connected to the second trace, a second spring mechanically connected to the second base button, and a second top button mechanically connected to the second spring and positioned to electrically contact a second face of the piezoelectric crystal, the second base button, the second spring, and the second top button each being electrically conductive.

2. The system of claim 1 wherein the first spring and the second spring are comprised of silver plated beryllium copper.

3. The system of claim 1 wherein the first base button and the first top button are comprised of silver.

4. The system of claim 1 wherein the second base button and the second top button are comprised of silver.

5. The system of claim 1 wherein the first trace and the second trace are comprised of copper.

6. The system of claim 1 wherein the first top button has a thickness "r" and the second top button has a thickness "t", with the thickness "r" being less than the thickness "t".

7. The system of claim 6 wherein the thickness "t" is approximately 0.15 inches.

8. The system of claim 1 wherein the height of the first spring connector is different than the height of the second spring connector.

9. The system of claim 1 further comprising at least one electrical component electrically connected in series between the first trace and the second trace to increase the impedance seen by the RF generator.

10. The system of claim 9 wherein the electrical component comprises a capacitor.

11. The system of claim 1 further comprising at least one electrical component electrically connected in parallel between the first trace and the second trace to increase the impedance seen by the RF generator.

12. The system of claim 11 wherein the electrical component comprises an inductor.

13. A system for making electrical connections to a piezoelectric crystal comprising:

a board member having a first trace adapted for electrical connection to an active terminal of an RF generator and a second trace adapted for electrical connection to the ground terminal of the RF generator, the first trace and the second trace comprising copper;

at least one first spring connector attached to the board member, the first spring connector comprising a first base button mechanically connected to the board member and electrically connected to the first trace, a first spring mechanically connected to the first base button, and a first top button having a thickness "r" and being mechanically connected to the first spring and being positioned to electrically contact a first face of a piezoelectric crystal, the first base button, the first spring, and the first top button each being electrically conductive;

at least one second spring connector attached to the board member, the second spring connector comprising a second base button mechanically connected to the board member and electrically connected to the second trace, a second spring mechanically connected to the second base button, and a second top button having a thickness "t" and being mechanically connected to the second spring and being positioned to electrically contact a second face of the piezoelectric crystal, the second base button, the second spring, and the second top button each being electrically conductive, and the thickness "t" being greater than the thickness "r".

14. The system of claim 13 wherein the first spring and the second spring are comprised of silver plated beryllium copper.

15. The system of claim 13 wherein the first base button and the first top button are comprised of silver.

16. The system of claim 13 wherein the second base button and the second top button are comprised of silver.

17. The system of claim 13 further comprising at least one electrical component electrically connected in series between the first trace and the second trace to increase the impedance seen by the RF generator.

18. The system of claim 17 wherein the electrical component comprises a capacitor.

19. The system of claim 13 further comprising at least one electrical component electrically connected in parallel between the first trace and the second trace to increase the impedance seen by the RF generator.

* * * * *